(12) United States Patent
Kwak et al.

(10) Patent No.: US 11,571,724 B2
(45) Date of Patent: Feb. 7, 2023

(54) APPARATUS AND METHOD FOR PROCESSING SUBSTRATE

(71) Applicant: SEMES Co., Ltd., Chungcheongnam-do (KR)

(72) Inventors: Ki Young Kwak, Gyeonggi-do (KR); Hyun Ho Lee, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/404,242

(22) Filed: Aug. 17, 2021

(65) Prior Publication Data

US 2022/0203415 A1 Jun. 30, 2022

(30) Foreign Application Priority Data

Dec. 29, 2020 (KR) .................. 10-2020-0186068

(51) Int. Cl.
| | |
|---|---|
| *B08B 13/00* | (2006.01) |
| *B08B 1/00* | (2006.01) |
| *B08B 1/04* | (2006.01) |
| *B08B 7/04* | (2006.01) |
| *B08B 7/02* | (2006.01) |
| *B25J 11/00* | (2006.01) |
| *B25J 15/00* | (2006.01) |

(52) U.S. Cl.
CPC .............. *B08B 13/00* (2013.01); *B08B 1/002* (2013.01); *B08B 1/04* (2013.01); *B08B 7/028* (2013.01); *B08B 7/04* (2013.01); *B25J 11/0095* (2013.01); *B25J 15/0028* (2013.01)

(58) Field of Classification Search
None
See application file for complete search history.

(56) References Cited

U.S. PATENT DOCUMENTS

| | | | | |
|---|---|---|---|---|
| 11,446,711 | B2* | 9/2022 | Wu | .............. H01L 21/67051 |
| 2017/0320188 | A1* | 11/2017 | Kweon | .............. B08B 3/12 |
| 2020/0126831 | A1* | 4/2020 | Feng | .............. B08B 3/02 |

FOREIGN PATENT DOCUMENTS

| | | |
|---|---|---|
| JP | 2009146975 A | 7/2009 |
| KR | 20090036700 A | 4/2009 |

* cited by examiner

*Primary Examiner* — Eric W Golightly
(74) *Attorney, Agent, or Firm* — RatnerPrestia

(57) ABSTRACT

A substrate processing apparatus includes a process module including a substrate support unit, an inverting unit and a processing unit, and a transfer module, wherein the inverting unit inverts a substrate so that a second surface faces upward, and provides the inverted substrate to the substrate support unit, wherein the processing unit performs a first processing on the second surface of the substrate seated on the substrate support unit, wherein the inverting unit inverts the first processed substrate so that the first surface faces upward, wherein the transfer module takes the substrate with a first surface facing upward out of the process module, and introduces again the substrate with a first surface facing upward into the process module to seat it on the substrate support unit, wherein the processing unit performs a second processing on the first surface of the substrate seated on the substrate support unit.

10 Claims, 13 Drawing Sheets

APPARATUS AND METHOD FOR PROCESSING SUBSTRATE

CROSS REFERENCE TO RELATED APPLICATION

This application claims the benefit of Korean Patent Application No. 10-2020-0186068, filed on Dec. 29, 2020, in the Korean Intellectual Property Office, the disclosure of which is incorporated herein by reference in its entirety.

FIELD OF THE INVENTION

The present invention relates to a substrate processing apparatus and method.

DESCRIPTION OF THE RELATED ART

When manufacturing a semiconductor device or a display device, various processes such as photography, etching, ashing, ion implantation, and thin film deposition are performed. Various treating liquids are used in each process, and contaminants and particles may be generated during the process. In order to solve this problem, a cleaning process for cleaning contaminants and particles is performed before and after each process.

SUMMARY OF THE INVENTION

An aspect of the present invention is a substrate processing apparatus and method capable of improving productivity by efficiently and quickly cleaning the front and back surfaces of a substrate.

The aspects of the present invention are not limited to the aspects mentioned above, and other aspects not mentioned will be clearly understood by those skilled in the art from the following description.

One aspect of the substrate processing apparatus of the present invention for achieving the above object comprises a process module including a substrate support unit for supporting a substrate, an inverting unit for inverting the substrate, and a processing unit for processing the substrate; and a transfer module for transferring a substrate to the process module, wherein the transfer module introduces a substrate with a first surface facing upward into the process module to seats it on the inverting unit, wherein the inverting unit inverts the substrate so that a second surface faces upward, and provides the inverted substrate to the substrate support unit, wherein the processing unit performs a first processing on the second surface of the substrate seated on the substrate support unit, wherein the inverting unit inverts the first processed substrate so that the first surface faces upward, wherein the transfer module takes the substrate with a first surface facing upward out of the process module, and introduces again the substrate with a first surface facing upward into the process module to seat it on the substrate support unit, wherein the processing unit performs a second processing on the first surface of the substrate seated on the substrate support unit.

Another aspect of the substrate processing apparatus of the present invention for achieving the above object comprises a first process module; a second process module; and a transfer module for transferring a substrate to the first process module and the second process module, wherein the transfer module provides a first substrate into a first process module, wherein the first process module performs a first processing on a first surface of the first substrate, wherein the transfer module provides again the first substrate into the first process module after taking the first processed first substrate out of the first process module, wherein the first process module performs a second processing on a second surface of the first substrate.

One aspect of the substrate processing method of the present invention for achieving the above object comprises providing a substrate processing apparatus including a substrate support unit for supporting a substrate, an inverting unit for inverting the substrate, a process module including a processing unit for processing the substrate, and a transfer module for transferring the substrate to the process module, introducing a substrate with a first surface facing upward into the process module to seat it on the inverting unit by the transfer module, inverting the substrate so that a second surface faces upward, and providing the inverted substrate to the substrate support unit by the inverting unit, performing a first processing on a second surface of the substrate seated on the substrate support unit by the processing unit, inverting the first processed substrate so that a first surface faces upward by the inverting unit, taking the substrate with a first surface facing upward out of the process module, and introducing again the substrate with a first surface facing upward into the process module to seat it on the substrate support unit by the transfer module, and performing a second processing on the first surface of the substrate seated on the substrate support unit by the processing unit.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
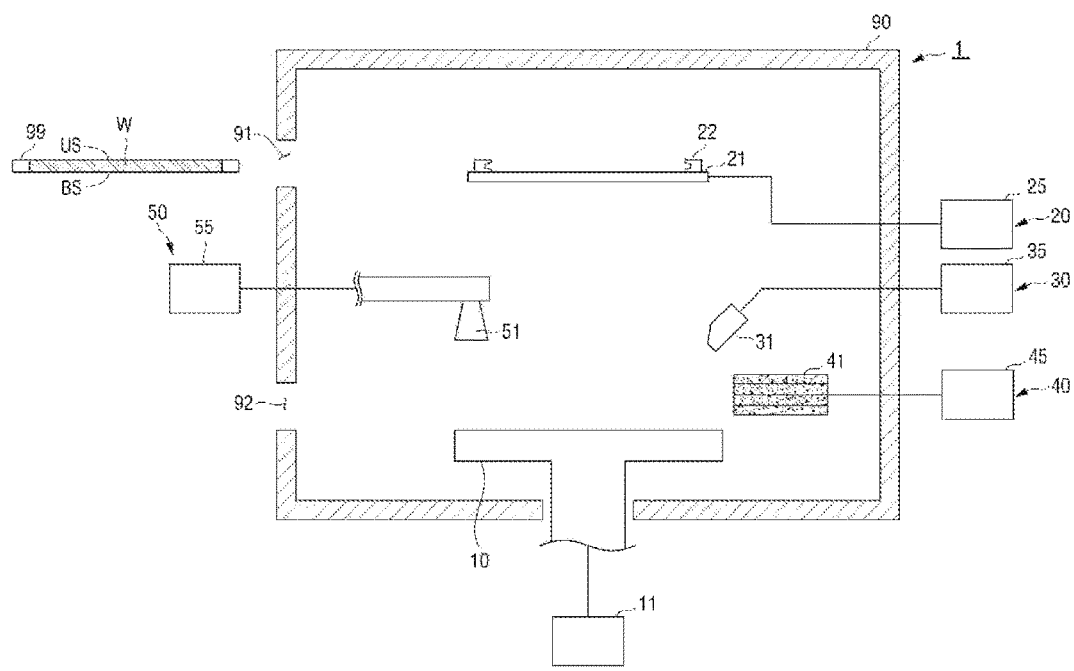
FIG. 1 is a conceptual diagram for describing a substrate processing apparatus according to some embodiments of the present invention.

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or layers, it includes not only when directly above of the other elements or layers, but also other elements or layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

Figure 2:
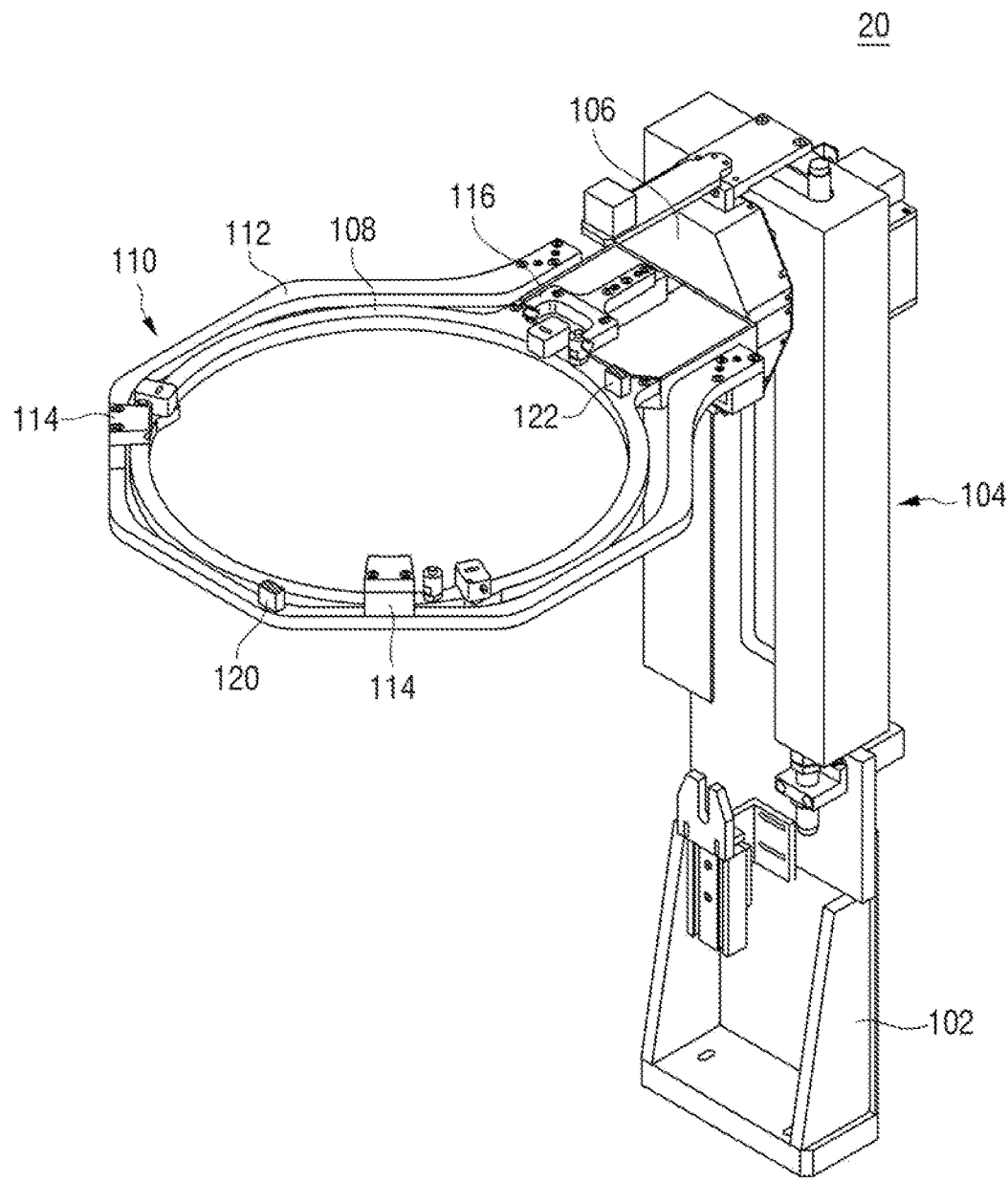
FIG. 2 is a perspective view for describing an exemplary configuration of the inverting unit shown in FIG. 1.

FIG. 1 is a conceptual diagram for describing a substrate processing apparatus according to some embodiments of the present invention. FIG. 2 is a perspective view for describing an exemplary configuration of the inverting unit shown in FIG. 1.

Referring to FIG. 1, a substrate processing apparatus according to some embodiments of the present invention includes a process module 1 and a transfer module 99.

The transfer module 99 introduces the substrate W into the process module 1 or takes out the substrate W from the process module 1. The transfer module 99 may be in the form of a robot arm, but is not limited thereto.

The process module 1 receives the substrate W from the transfer module 99 to process (e.g., clean) the substrate. According to the substrate processing apparatus according to some embodiments of the present invention, both the first surface (i.e., upper surface or front surface) and the second surface (i.e. rear surface or back surface) of the substrate W are processed in one process module 1 (i.e., one chamber 90).

This process module 1 includes a chamber 90, a substrate support unit 10, an inverting unit 20, and at least one processing unit 30, 40, 50.

The substrate is seated on the substrate support unit 10, which may be selectively rotated by the power source of the driving unit 11.

The at least one processing unit 30, 40, 50 may include, for example, a first processing unit 40 for performing physical cleaning using a brush, a second processing unit 50 for performing cleaning using ultrasonic waves, and a third processing unit 30 for performing cleaning by discharging the rinse solution, but is not limited thereto.

The first processing unit 40 may include a brush 41 in contact with the first surface US or the second surface BS of the substrate W and for physically cleaning the substrate W, and a driving unit 45 for rotating the brush 41 and moving the position of the brush 41 and the like. The brush 41 may be, for example, a roll-type brush, but is not limited thereto. The brush 41 scrub-cleans the substrate W while contacting the substrate W with a predetermined pressure and rotating at a predetermined speed. Since the rotation speed of the brush 41 has a correlation with the rotation speed of the substrate support unit 10, the rotation speed of the brush 41 may be changed according to the rotation speed of the substrate support unit 10. In order to uniformly clean the entire surface of the substrate W, protrusions of different shapes may be formed on the surface of the brush 41 along the longitudinal direction, or the outer diameter may vary according to the longitudinal direction of the brush 41. The overall length of the brush 41 may also vary depending on the design.

The second processing unit 50 may include the sonic nozzle 51 for providing ultrasonic waves to the first surface US or the second surface BS of the substrate W, and a driving unit 55 for causing the sonic nozzle 51 to generate acoustic energy and moving the position of the sonic nozzle 51. The sonic nozzle 51 may have a cylindrical structure having a unit surface that becomes wide downward as shown. Alternatively, the sonic nozzle 51 may be perpendicular to the surface of the substrate support unit 10 or may be inclined at an oblique angle. At least one piezo element for generating acoustic energy may be installed in the sonic nozzle 51.

The third processing unit 30 may include a cleaning nozzle 31 for providing a chemical solution (e.g., cleaning solution) to the first surface US or the second surface BS of the substrate W, a chemical solution storage unit 30 for supplying the chemical solution to the cleaning nozzle 31, and a driving unit (not shown) for moving the position of the cleaning nozzle 31. When the cleaning nozzle 31 is a movable type, the cleaning nozzle 31 may wait in the standby position, and move to the chemical solution supply position (e.g., in the upper direction of the substrate W) to discharges the chemical solution onto the substrate W. Alternatively, the cleaning nozzle 31 may be a fixed type installed at a specific position in the chamber 90. The chemical solution may be pure water (DIW), ozone water ($O_3$DIW), DHF (Diluted HF), SPM (mixture of $H_2SO_4$ and $H_2O_2$), and DSP (mixture of $H_2SO_4$, HF and $H_2O_2$), but is not limited thereto.

The inverting unit 20 includes a buffer 21, on which the substrate W is seated, a chucking arm 22 disposed around the edge of the buffer 21 and for chucking the side surface of the substrate W at a plurality of positions, a driving unit 25 for driving the buffer 21 and the chucking arm 22, and the like. An exemplary structure of the inverting unit 20 will be described later with reference to FIG. 2.

When the transfer module 99 seats the substrate W on the buffer 21, the chucking arm 22 chucks and fixes the side surface of the substrate W. Then, the inverting unit 20 rotates (i.e., the buffer 21 and the chucking arm 22 rotate together with the substrate W) to invert the substrate W. As a result of inverting, the second surface (back surface) BS of the substrate W faces upward. The inverting unit 20 moves downward to seat the inverted substrate W on the substrate support unit 10. Then, the inverting unit 20 moves upward, and waits while the processing units 30, 40, and 50 process the substrate W. When the processing of the substrate W is finished, the inverting unit 20 moves downward so that the chucking arm 22 chucks the side surface of the substrate W. Then, the inverting unit 20 moves upward and rotates again (that is, the buffer 21 and the chucking arm 22 rotate together with the substrate W), thereby inverting the substrate W. As a result of the inverting, the first surface (front surface) US of the substrate W faces upward. The transfer module 99 takes out the substrate W on the buffer 21.

Meanwhile, the substrate support unit 10, the inverting unit 20, and the processing units 30, 40, 50 are installed in the chamber 90. A first opening 91 and a second opening 92 that are different from each other are installed in the chamber 90.

The transfer module 99 may directly transfer the substrate W to the inverting unit 20 through the first opening 91. In addition, the first processed substrate W on the inverting unit 20 may be taken out of the chamber 90 through the first opening 91. The first processed substrate W may be a substrate W, in which a second surface (e.g., a back surface) has been cleaned or etched. Also, the transfer module 99 may directly transfer the substrate W to the substrate support unit 10 through the second opening 92. Also, the second processed substrate W on the substrate support unit 10 may be taken out of the chamber 90 through the second opening 92. The second processed substrate W may be a substrate W, in which a first surface (e.g., a front surface) has been cleaned.

The first processing and the second processing may be cleaning processes. For example, the first processing may be brush cleaning by the first processing unit 40, and the second processing may be ultrasonic cleaning by the second processing unit 50, but is not limited thereto.

Alternatively, the first processing may be an etching process, and the second processing may be a cleaning process. For example, when a deposition process is performed on the substrate W, unnecessary films may be formed on the back surface as well as the front surface. In this case, the unnecessary film formed on the back surface may be etched to remove it (etching process), and then the foreign material formed on the front surface may be removed (cleaning process).

Here, referring to FIG. 2, the inverting unit 20, in order to clean the back surface of the substrate W, includes a handler 110 for inverting the substrate W, the sensors 120 and 122 for detecting the seating state of the substrate W seated on the handler 110 by emitting and receiving at least one optical signal SENSE1 and SENSE2 in the horizontal direction with the substrate W, a driving unit 104 for rotating or moving the handler 110 up and down, and a control unit (not shown) for determining a normal or abnormal seating state of the substrate W through the optical signal sensed by the sensors 120 and 122.

As shown, the handler 110 includes a buffer 108, on which the substrate W is seated, a chucking arm 112 for chucking the substrate W seated on the buffer 108 with chucking blocks 114 and 116 provided at a plurality of positions, and a head 106 coupled to one side the chucking arm 112 and the buffer 108 for driving the chucking arm 112 to chuck the substrate W seated on the buffer 108.

The driving unit 104 is provided with, for example, a guide, a guide rail, a motor, a cylinder, a cam, a gear, a belt, and a pulley, and rotate and move the head 106 so that the handler 110 is rotated or slid up and down. The driving unit 104 rotates the head 106 to invert the handler 110, and moves the handler 110 to load the substrate W into the substrate support unit or unload the substrate W from the substrate support unit. In addition, the driving unit 104 includes a support frame 102 installed on the lower base frame (not shown) to fix the inverting unit 20 inside the chamber.

The sensors 120 and 122 include a light emitting unit 120 that generates at least one optical signal SENSE1 and SENSE2 and a light receiving unit 122 that receives the respective optical signals SENSE1 and SENSE2 in response to the light emitting unit 120, and the light emitting unit 120 and the light receiving unit 122 are installed on the chucking arm 112 to face each other. Accordingly, the sensors 120 and 122 emit and receive the optical signals SENSE1 and SENSE2 horizontally with the substrate W seated on the buffer 108. To this end, the light emitting unit 120 includes at least one light emitting device (not shown) that generates at least one optical signal SENSE1 and SENSE2, and the light receiving unit 122 includes at least one light receiving device (not shown) that receives at least one optical signal SENSE1 and SENSE2. For example, the light emitting unit 120 maintains a predetermined distance (e.g., less than 1 mm) from the lower surface (i.e., the front surface of the wafer) of the substrate W seated on the buffer 108 to generate one optical signal SENSE1 horizontally. As another example, the light emitting unit 120 maintains a predetermined distance (e.g., less than 1 mm) from various positions, i.e., from the upper surface and the lower surface of the substrate W seated on the buffer 108, to generate a plurality of optical signals SENSE1 and SENSE2 horizontally. Therefore, the sensors 120 and 122 emit and receive the optical signals SENSE1 and SENSE2 from the side surface of the substrate W, thereby accurately detecting whether the substrate W seated on the buffer 108 is in a normal state or an abnormal state.

Referring to the configuration of the inverting unit 20, the inverting unit 20 may load the inverted substrate W on the substrate support unit 10. That is, since the inverting unit 20 inverts the substrate W to load it on the substrate support unit 10, the second surface (back surface) BS of the substrate W faces upward.

However, after the substrate W is seated on the buffer 21, the inverting unit 20 cannot load the substrate W onto the substrate support unit 10 without inverting the substrate W. That is, when the substrate W is seated on the buffer 21 so that the first surface (front surface) US of the substrate W faces upward, it cannot be loaded on the substrate support unit 10 so that the first surface US of the substrate W faces upward. This is because the buffer 21 is located under the substrate W, and only the buffer 21 cannot be moved to be separated from the substrate W separately.

Therefore, in one transfer module 99, in order to process both the first surface (front surface) US and the second surface (back surface) BS of one substrate W, the substrate processing method described with reference to FIGS. 3 to 11 may be used.

Figure 3:
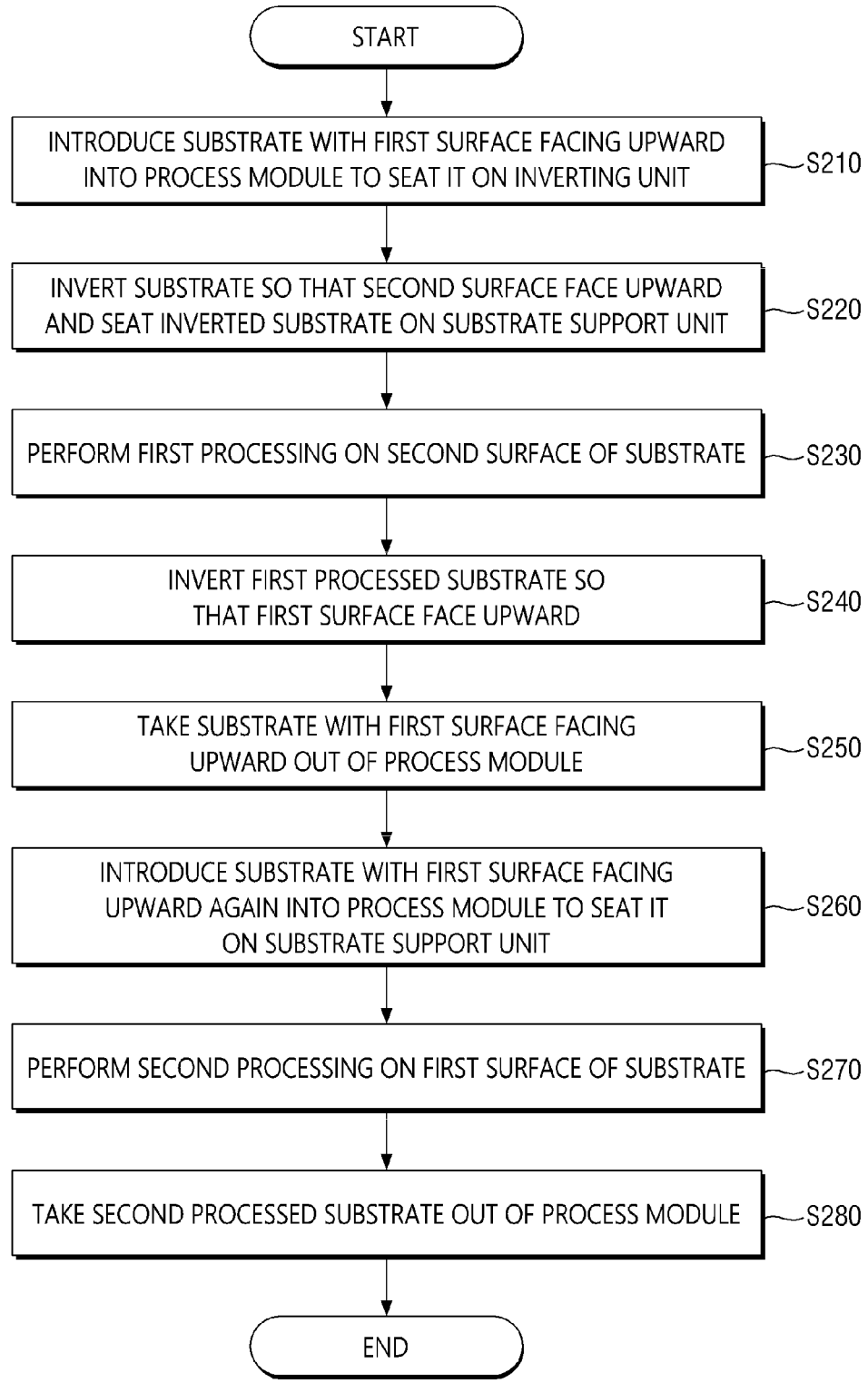
FIG. 3 is a flowchart for describing a substrate processing method according to some embodiments of the present invention.

FIG. 3 is a flowchart for describing a substrate processing method according to some embodiments of the present invention. FIGS. 4 to 11 are views of intermediate steps for describing the substrate processing method of FIG. 3.

Figure 4:
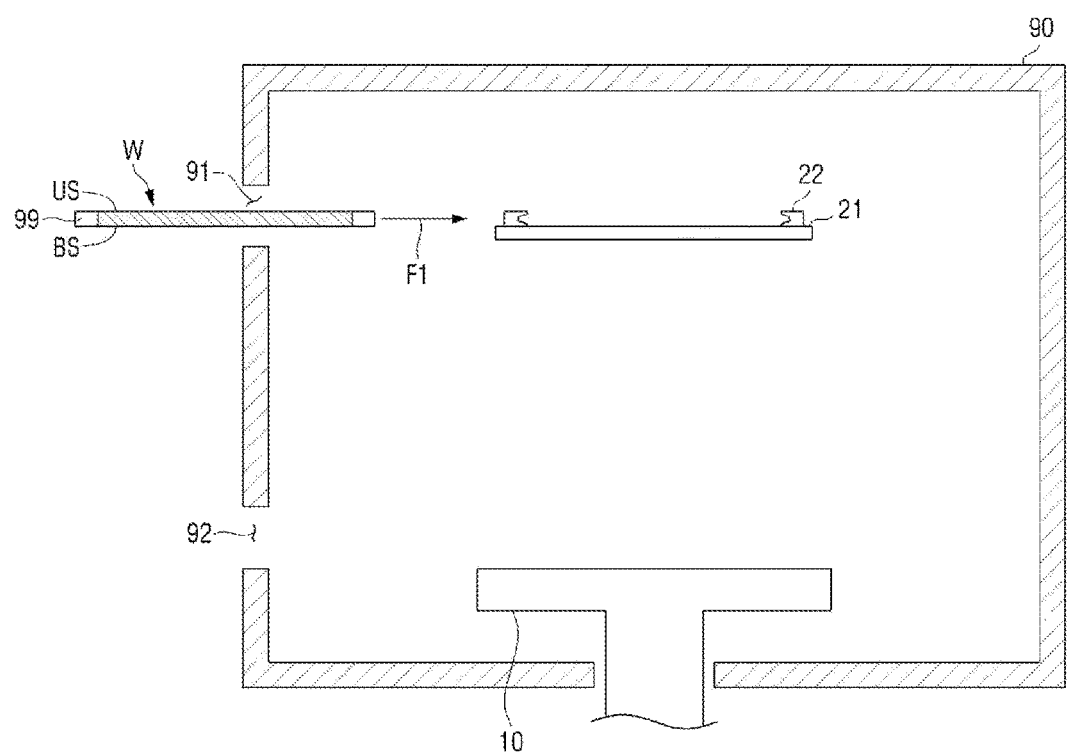
FIGS. 4 to 11 are views of intermediate steps for describing the substrate processing method of FIG. 3.

Referring to FIGS. 3 and 4, the substrate W with the first surface US facing upward is introduced into the process module (i.e., into the chamber 90) and seated on the inverting unit 20 (S210).

Specifically, the transfer module seats the substrate W with the first surface US facing upward 99 on the buffer 21 through the first opening 91 of the chamber 90. The chucking arm 22 of the inverting unit 20 chucks and fixes the side surface of the substrate W.

Figure 5:
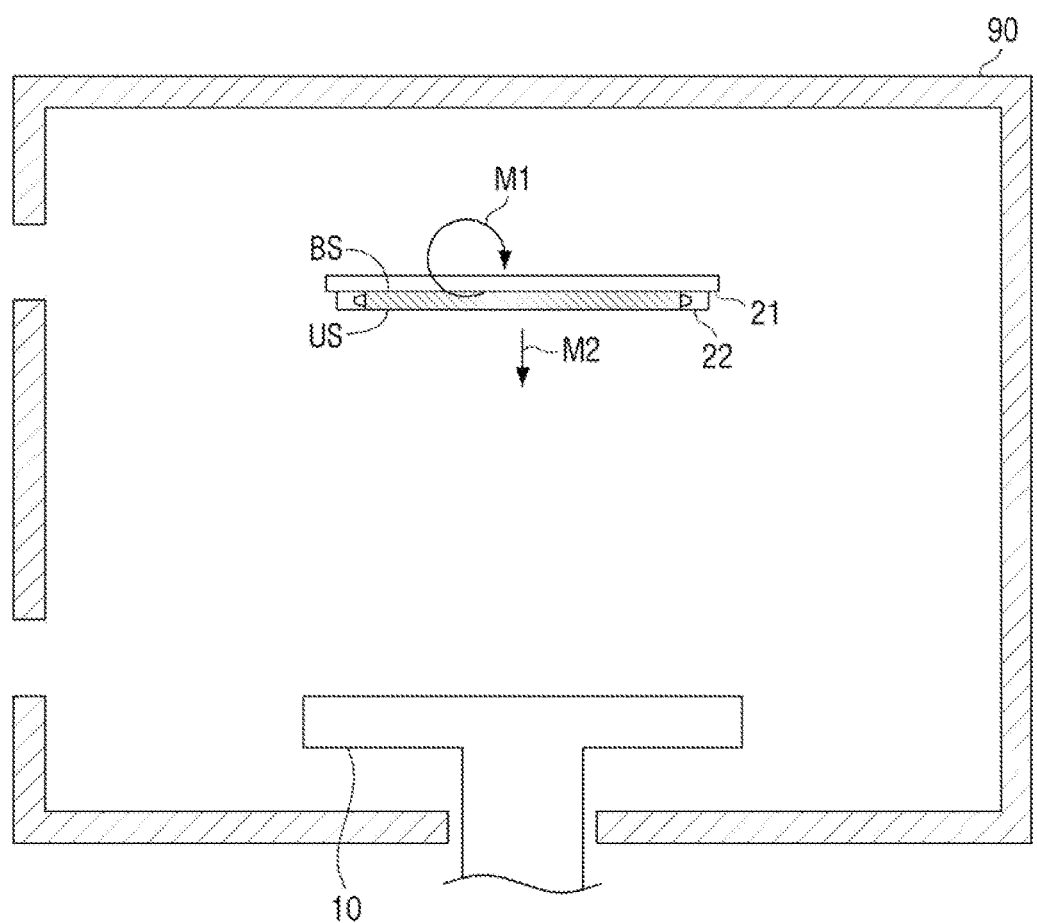

Referring to FIGS. 3 and 5, the substrate W is inverted so that the second surface BS faces upward, and the inverted substrate W is seated on the substrate support unit 10 (S220).

Specifically, since the chucking arm 22 fixes the substrate W, the buffer 21 and the chucking arm 22 rotate to invert the substrate W (see reference numeral M1). In the inverted substrate W, the first surface US faces the substrate support unit 10, and the second surface BS faces upward. Then, the inverting unit 20 (i.e., the buffer 21 and/or the chucking arm 22) moves downward (see reference numeral M2), and seats the inverted substrate W on the substrate support unit 10.

Figure 6:
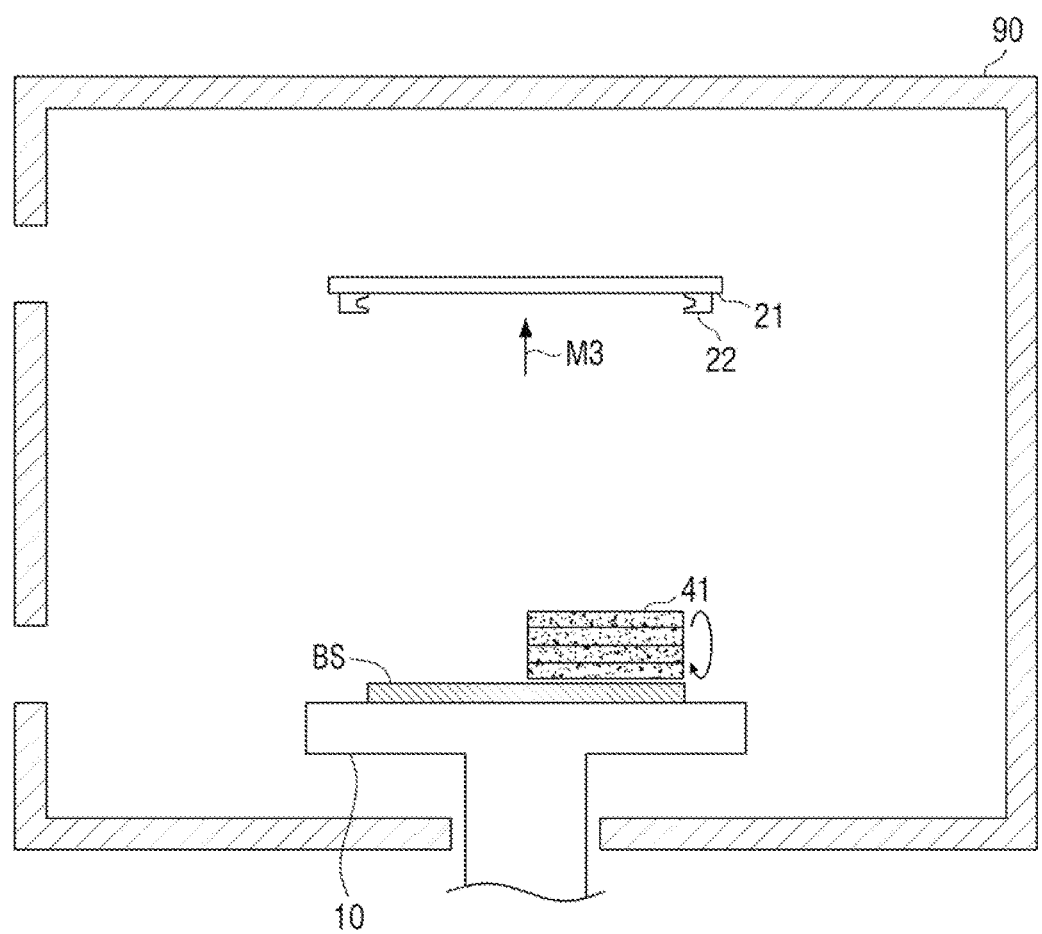

Referring to FIGS. 3 and 6, the first processing is performed on the second surface BS of the substrate W (S230).

Specifically, the inverted substrate W is seated on the substrate support unit 10, and the second surface BS of the substrate W faces upward.

The inverting unit 20 (that is, the buffer 21 and/or the chucking arm 22) moves upward (see reference numeral M3), and waits while the first processing unit 40 processes the substrate W.

The brush 41 of the first processing unit 40 moves on the second surface BS of the substrate W. The brush 41 contacts the second surface BS of the substrate W with a predetermined pressure and rotates at a predetermined speed to perform a first processing (scrub cleaning) of the substrate W.

Figure 7:
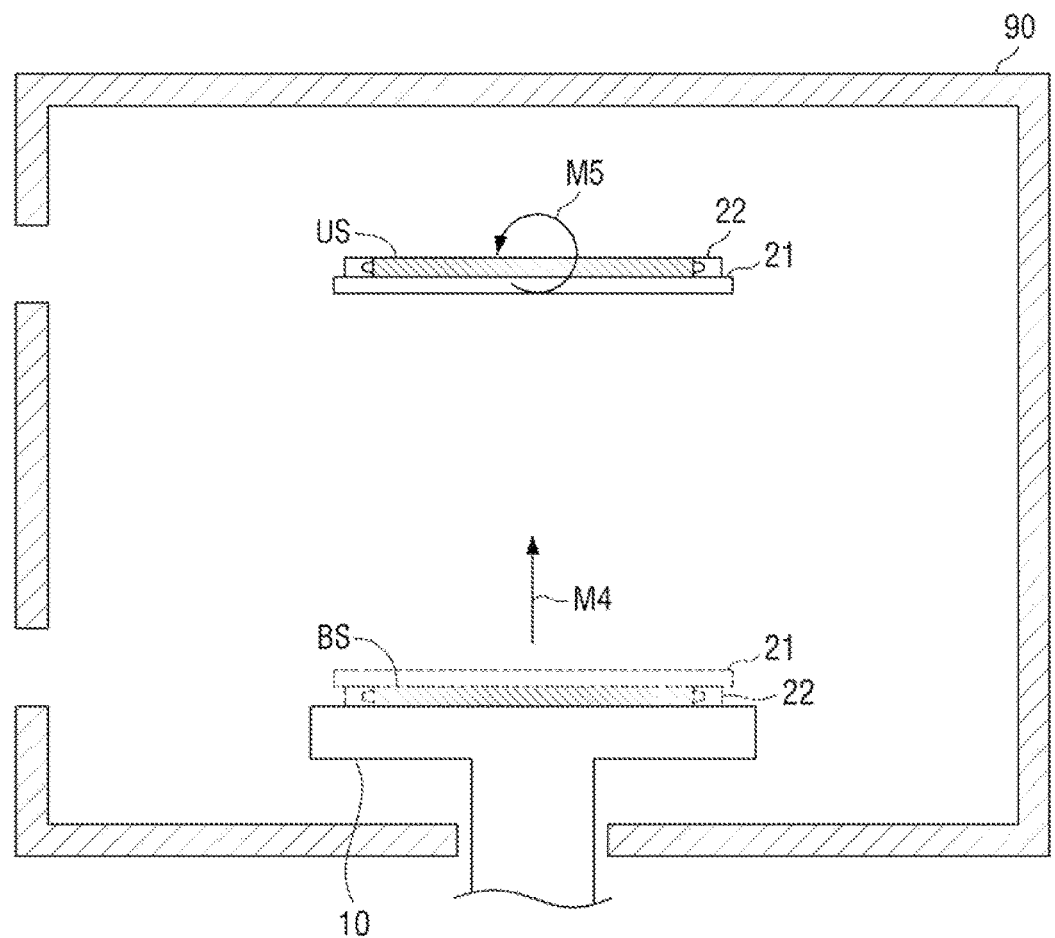

Referring to FIGS. 3 and 7, the first processed substrate W is inverted so that the first surface US faces upward (S240).

Specifically, when the first processing (e.g., scrub cleaning) of the substrate W is finished, the inverting unit 20 (i.e., the buffer 21 and/or the chucking arm 22) moves downward, and the chucking arm 22 chucks the side surface of the substrate W. Then, the inverting unit 20 (i.e., the buffer 21 and/or the chucking arm 22) moves upward (see reference numeral M4).

Then, the inverting unit 20 (i.e., the buffer 21 and/or the chucking arm 22) rotates together with the substrate W to invert the substrate W (see reference numeral M5). As a result of inverting, the first surface (front surface) US of the substrate W located on the buffer 21 faces upward.

Figure 8:
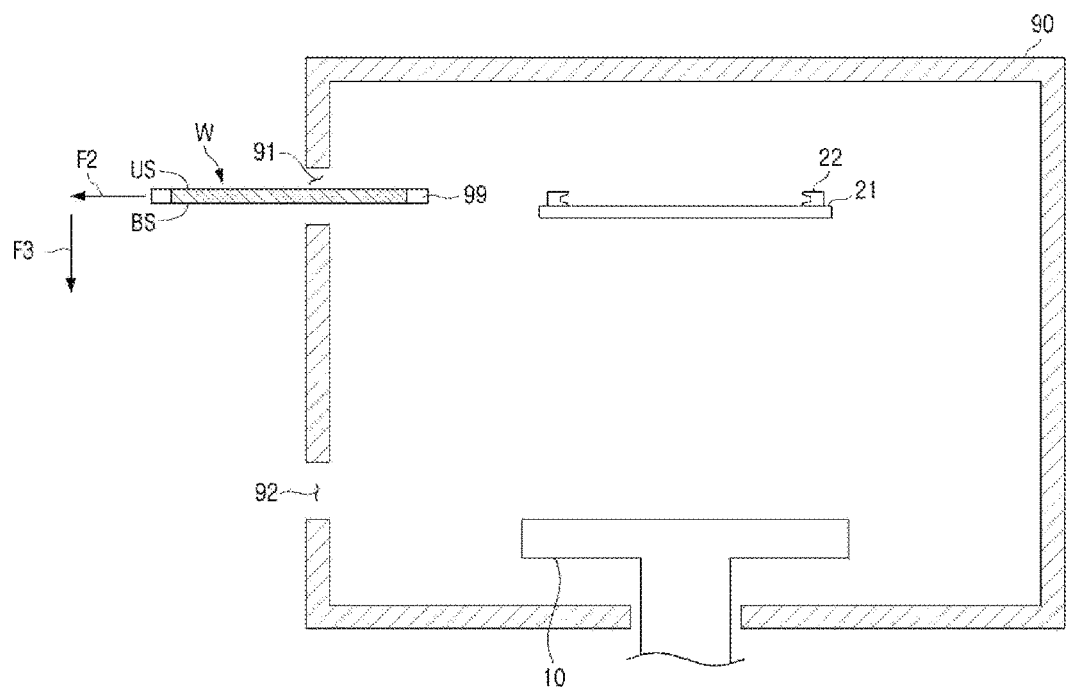

Referring to FIGS. 3 and 8, the substrate W with the first surface US facing upward is taken out of the process module 99 (S250).

Specifically, the transfer module 99 takes the substrate W with the first surface US facing upward out of the process module (i.e., the chamber 90) through the first opening 91 (see reference numeral F2).

Then, the transfer module 99 moves the substrate W to a position corresponding to the second opening 92 (for example, in a downward direction) (see reference numeral F3).

Figure 9:
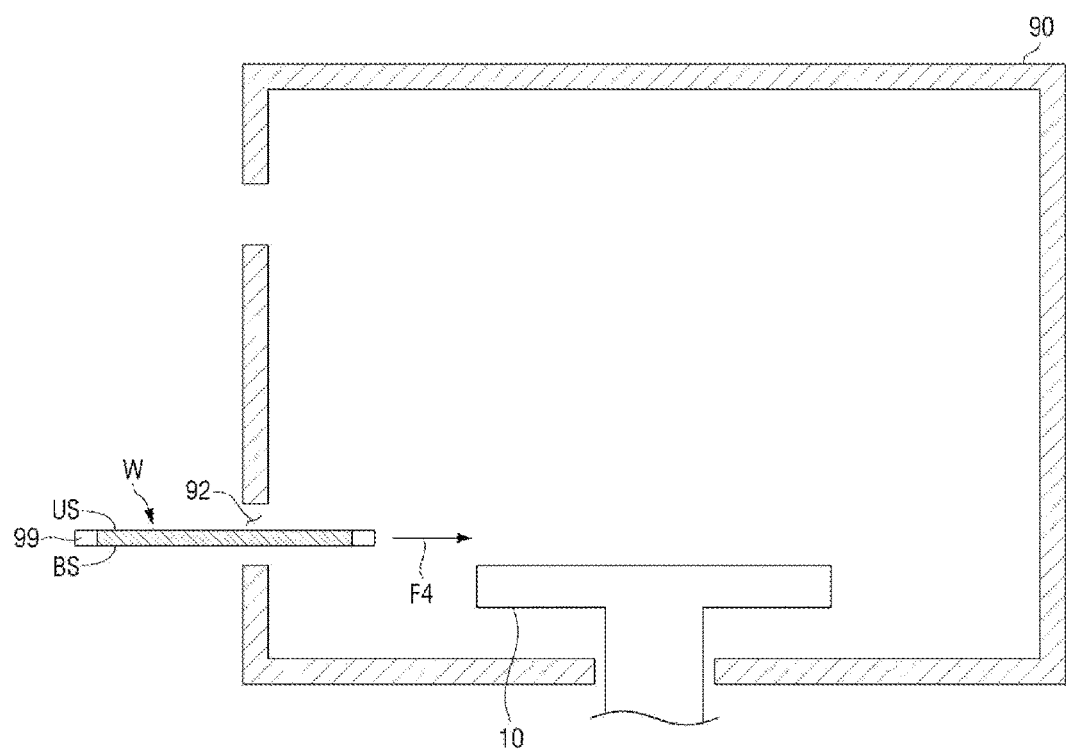

Referring to FIGS. 3 and 9, the substrate W with the first surface US facing upward is introduced into the process module 1 again and seated on the substrate support unit 10 (S260). Specifically, the transfer module 99 seats the substrate W with the first surface US facing upward on the substrate support unit 10 through the second opening 92 of the chamber 90 (see reference numeral F4).

Figure 10:
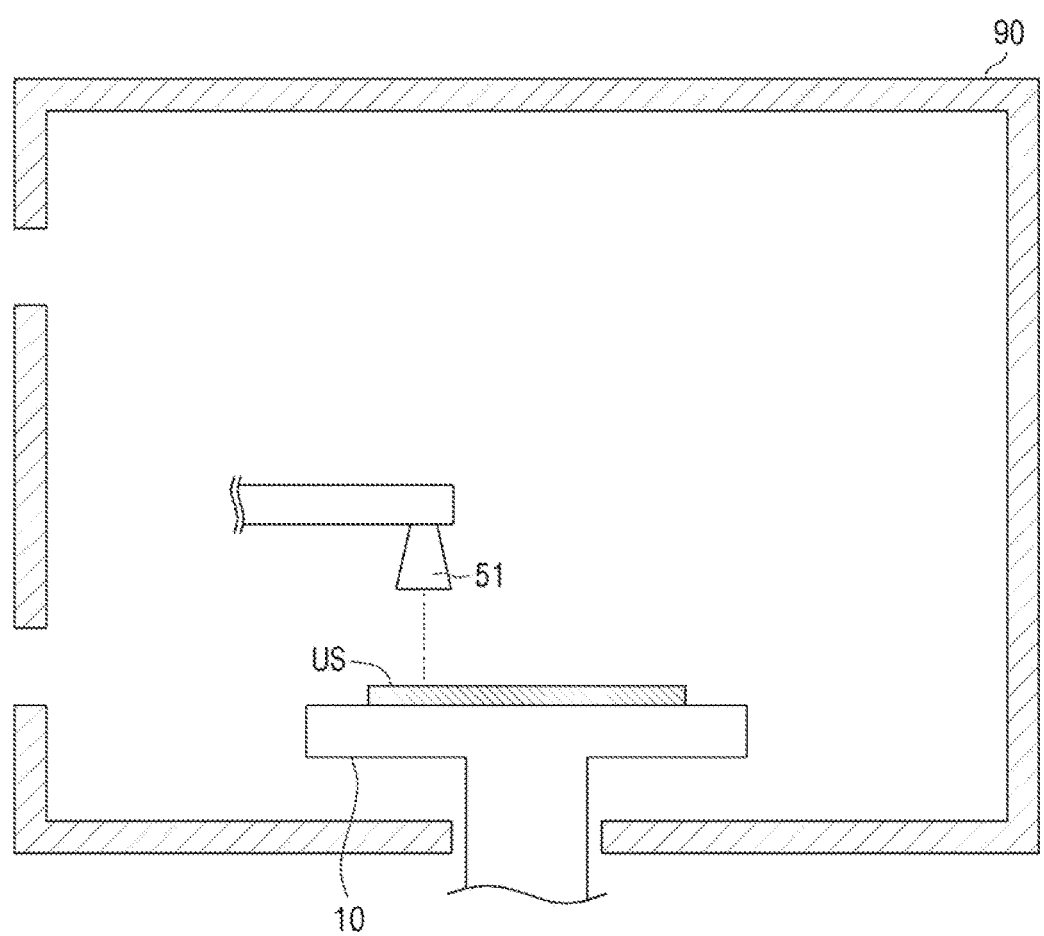

Referring to FIGS. 3 and 10, a second processing is performed on the first surface US of the substrate W (S270).

For example, the substrate W is seated on the substrate support unit 10, and the first surface US of the substrate W faces upward. The sonic nozzle 51 of the second processing unit 50 moves on the first surface US of the substrate W. Acoustic energy is generated from the sonic nozzle 51 to perform a second processing (ultrasonic cleaning) of the substrate W.

Figure 11:
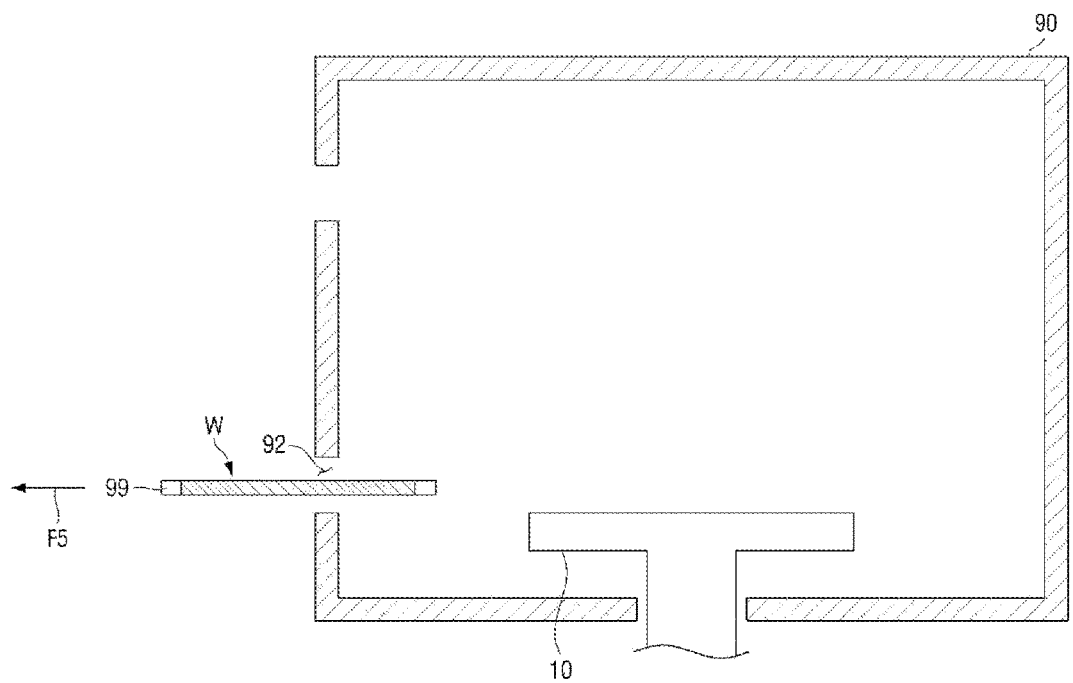

Referring to FIGS. 3 and 11, the second processed substrate W is taken out of the process module 1 (S280).

Specifically, when the second processing (e.g., ultrasonic cleaning) of the substrate W is finished, the transfer module 99 takes the second processed substrate W out of the process module 1 (i.e., the chamber 90) through the second opening 92 (see reference numeral F5).

Figure 12:
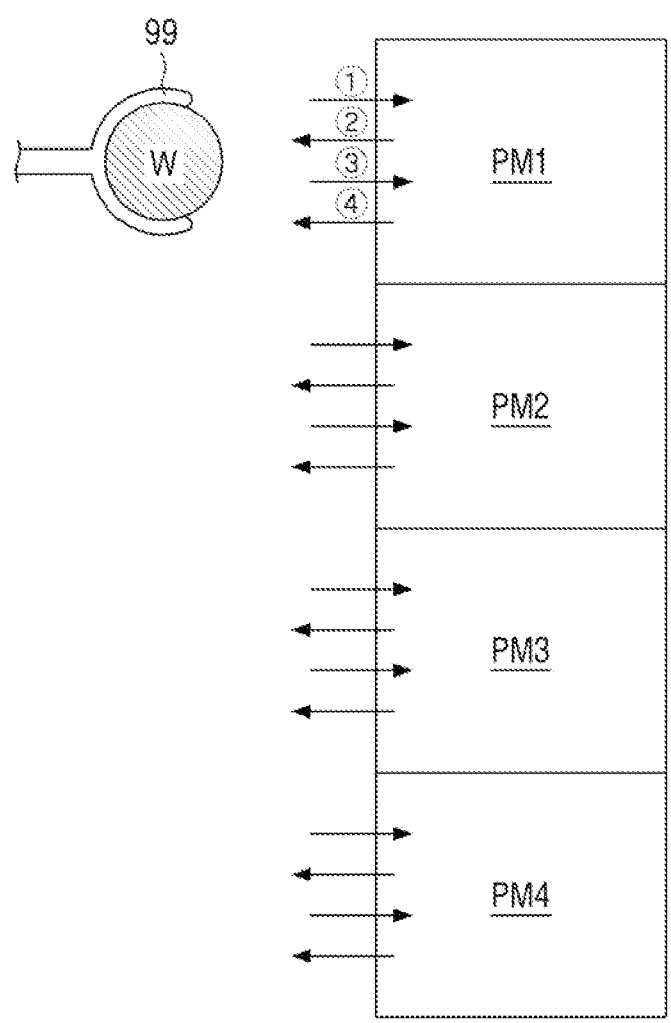
FIG. 12 is a conceptual diagram for describing a substrate processing method according to another embodiment of the present invention.

FIG. 12 is a conceptual diagram for describing a substrate processing method according to another embodiment of the present invention. For convenience of description, contents substantially the same as those described with reference to FIGS. 1 to 11 will be omitted.

Referring to FIG. 12, a plurality of process modules PM1, PM2, PM3, and PM4 are included. Each of the plurality of process modules 1 processes both the front and back surfaces of the substrate W.

For example, the transfer module 99 provides a first substrate into the first process module PM1 (see reference numeral ①), and the first process module PM1 performs a first processing on a second surface (e.g., back surface) of the first substrate, and the transfer module 99 takes the first processed first substrate out of the first process module PM1 (see reference numeral ②) and then provides the first substrate again into the first process module PM1 (see reference numeral ③), and the first process module PM1 performs a second processing on the first surface (e.g., front surface) of the first substrate. The transfer module 99 takes the second processed first substrate out of the first process module PM1 (see reference numeral ④).

As described above, the first process module PM1 may include a chamber including a first opening and a second opening that are different from each other. After the transfer module 99 takes the first processed first substrate out of the first process module PM1 through the first opening, the transfer module 99 provides the first substrate into the first process module through the second opening.

Both the first processing and the second processing may be cleaning processes.

Alternatively, the first processing may be an etching process, and the second processing may be a cleaning process.

Similarly, the transfer module 99 provides a second substrate different from the first substrate into the second process module PM2, the second process module PM2 performs a first processing on a second surface (e.g., a back surface) of the second substrate, the transfer module provides the second substrate again into the second process module PM2 after taking the first processed second substrate out of the second process module PM2, and the second process module PM2 performs a second processing on the first surface (e.g., the front surface) of the second substrate.

Each of the plurality of process modules 1 processes the front and back surfaces of the substrate W. This processing method (i.e., a method, in which one process module 1 processes both the front surface and the back surface) is more efficient compared to the method of configuring two process modules 1 as a processing pair (i.e., one process module 1 processes only a back surface and the other process module processes only a front surface). A reason why it is more efficient will be described with reference to FIGS. 13 to 16.

FIGS. 13 to 16 are diagrams for describing effects of a substrate processing method according to some embodiments of the present invention.

Figure 13:
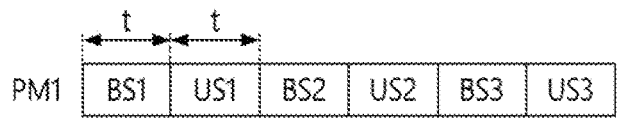
FIGS. 13 to 16 are diagrams for describing effects of a substrate processing method according to some embodiments of the present invention.
Figure 14:
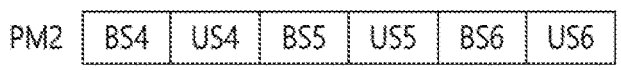
Figure 15:
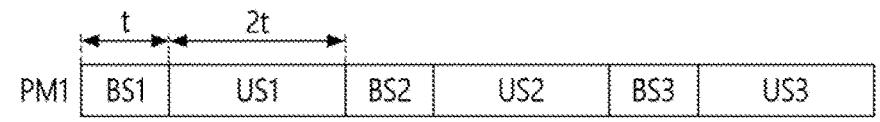
Figure 16:
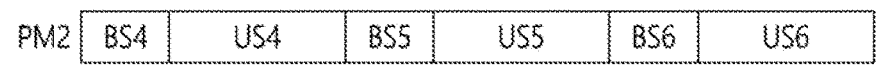

FIGS. 13 and 15 are cases, in which one process module PM1, PM2 processes both the front and back surfaces, and FIGS. 14 and 16 show methods, in which one process module PM11 processes only the back surface and the other process module PM12 processes only the front surface.

First, referring to FIGS. 13 and 14, it is assumed that the time to perform each of the back surface processing BS1 to BS6 is t, and the time to perform each of the front surface processing US1 to US6 is t. That is, the case where the back surface processing time (e.g., BS1) and the front surface processing time (e.g., US1) are substantially the same is exemplified. In FIGS. 13 and 14, for convenience of comparison, only the time required for processing the substrate is shown, but not the moving time of the substrate.

As shown in FIG. 13, the process module PM1 sequentially processes three substrates. That is, the back surface processing BS1 and the front surface processing US1 of the first substrate, the back surface processing BS2 and the front surface processing US2 of the second substrate, and the back surface processing BS3 and the front surface processing US3 of the third substrate are sequentially performed.

Another process module PM2 also processes these three substrates sequentially. That is, the back surface processing BS4 and the front surface processing US4 of the first substrate, the back surface processing BS5 and the front surface processing US5 of the second substrate, and the back surface processing BS6 and the front surface processing US6 of the third substrate are sequentially performed.

Accordingly, the time required for the two process modules PM1 and PM2 to process a total of six substrates is 6t.

On the other hand, as shown in FIG. 14, it is assumed that the process module PM11 performs only the back surface processing of the substrate, and the process module PM12 performs only the front surface processing of the back surface processed substrate.

The process modules PM11 and PM12 sequentially process six substrates. That is, the process module PM11 processes only the back surface of the six substrates (BS1, BS2, BS3, BS4, BS5, BS6). The process module PM12 processes only the front surfaces of six substrates (US1, US2, US3, US4, US5, US6).

However, the time required for the two process modules PM1 and PM2 to process a total of six substrates is 7t. This is because, while the process module PM11 processes the back surface of the first substrate (see BS1), the process module PM12 waits because there is no substrate to be processed.

In FIGS. 15 and 16, it is assumed that the time to perform each of the back surface processing BS1 to BS6 is t, and the time to perform each of the front surface processing US1 to US6 is 2t. That is, a case where the back surface processing time (e.g., BS1) and the front surface processing time (e.g., US1) are different from each other is exemplified. In FIGS. 15 and 16, for convenience of comparison, only the time required for processing the substrate is shown, but not the moving time of the substrate.

As shown in FIG. 15, the process module PM1 sequentially processes three substrates. That is, the back surface processing BS1 and the front surface processing US1 of the first substrate, the back surface processing BS2 and the front surface processing US2 of the second substrate, and the back surface processing BS3 and the front surface processing US3 of the third substrate are sequentially performed.

Another process module PM2 also processes these three substrates sequentially. That is, the back surface processing BS4 and the front surface processing US4 of the first substrate, the back surface processing BS5 and the front surface processing US5 of the second substrate, and the back surface processing BS6 and the front surface processing US6 of the third substrate are sequentially performed.

Accordingly, the time required for the two process modules PM1 and PM2 to process a total of six substrates is 9t (=t+2t+t+2t+t+2t).

On the other hand, as shown in FIG. 16, it is assumed that the process module PM11 performs only the back surface processing of the substrate, and the process module PM12 performs only the front surface processing of the back surface processed substrate.

The process modules PM11 and PM12 sequentially process six substrates. That is, the process module PM11 processes only the back surfaces of the six substrates (BS1, BS2, BS3, BS4, BS5, BS6). The process module PM12 processes only the front surfaces of six substrates (US1, US2, US3, US4, US5, US6).

However, the time required for the two process modules PM11 and PM12 to process a total of six substrates is 13t (=t+2t+2t+2t+2t+2t+2t). While the process module PM11 processes the back surface of the first substrate (see BS1), the process module PM12 waits because there is no substrate to be processed. In addition, since the front surface processing time 2t is longer than the back surface processing time t, a time, in which the process module PM11 does not work and waits, occurs.

Accordingly, it can be seen that the substrate processing method (i.e., a method, in which one process module PM1, PM2 processes both the front surface and the back surface) according to some embodiments of the present invention is faster and more efficient than the method of configuring two process modules PM11, PM12 as a pair (i.e., is, one process module PM11 performs only the back surface processing and the other process module PM12 performs only the front surface processing).

Also, in the method of configuring the two process modules PM11 and PM12 as a processing pair, when an abnormality occurs in one process module (e.g., PM11) of the processing pair, the other process module PM12 will also be stopped from working.

On the other hand, in the substrate processing method according to some embodiments of the present invention, since all the process modules PM1 and PM2 operate individually, an abnormality of one process module (e.g., PM1) does not affect the other process module (e.g., PM2).

Although the embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. An apparatus for processing a substrate comprising:
a process module including a substrate support unit for supporting a substrate, an inverting unit for inverting the substrate, and a processing unit for processing the substrate; and
a transfer module for transferring a substrate to the process module,
wherein the transfer module introduces a substrate with a first surface facing upward into the process module to seat the substrate on the inverting unit,
wherein the inverting unit inverts the substrate so that a second surface faces upward, and provides the inverted substrate to the substrate support unit,
wherein the processing unit performs a first processing on the second surface of the substrate seated on the substrate support unit,
wherein the inverting unit inverts the first processed substrate so that the first surface faces upward,
wherein the transfer module takes the substrate with a first surface facing upward out of the process module, and introduces again the substrate with a first surface facing upward into the process module to seat the subrate on the substrate support unit, and
wherein the processing unit performs a second processing on the first surface of the substrate seated on the substrate support unit.

2. The apparatus of claim 1, wherein the process module comprises a chamber including a first opening and a second opening that are different from each other, and
wherein the support unit, the inverting unit, and the processing unit are installed in the chamber.

3. The apparatus of claim 2, wherein the transfer module takes the substrate with a first surface facing upward out of the process module through the first opening, and
wherein the transfer module introduces the substrate with a first surface facing upward into the process module through the second opening to seat the subrate on the substrate support unit.

4. The apparatus of claim 1, wherein the inverting unit comprises a buffer, on which a substrate is seated, and a chucking arm disposed around an edge of the buffer to chuck a side surface of the substrate seated on the buffer at a plurality of positions.

5. The apparatus of claim 1, wherein a first time for performing the first processing is different from a second time for performing the second processing.

6. The apparatus of claim 1, wherein the first processing and the second processing are cleaning processes.

7. The apparatus of claim 6, wherein the first processing is brush cleaning, and the second processing is ultrasonic cleaning.

8. The apparatus of claim 1, wherein the first processing is an etching process, and the second processing is a cleaning process.

9. A method for processing a substrate comprising:
providing a substrate processing apparatus including a substrate support unit for supporting a substrate, an inverting unit for inverting the substrate, a process module including a processing unit for processing the substrate, and a transfer module for transferring the substrate to the process module;
introducing a substrate with a first surface facing upward into the process module to seat the substrate on the inverting unit by the transfer module;
inverting the substrate so that a second surface faces upward, and providing the inverted substrate to the substrate support unit by the inverting unit;
performing a first processing on the second surface of the substrate seated on the substrate support unit by the processing unit;
inverting the first processed substrate so that a first surface faces upward by the inverting unit;
taking the substrate with a first surface facing upward out of the process module, and introducing again the substrate with a first surface facing upward into the process module to seat the substrate on the substrate support unit by the transfer module; and
performing a second processing on the first surface of the substrate seated on the substrate support unit by the processing unit.

10. The method of claim 9, wherein the process module comprises a chamber including a first opening and a second opening that are different from each other,
wherein the support unit, the inverting unit, and the processing unit are installed in the chamber,
wherein the transfer module takes the substrate with a first surface facing upward out of the process module through the first opening, and
wherein the transfer module introduces the substrate with a first surface facing upward into the process module through the second opening to seat the substrate on the substrate support unit.

* * * * *